United States Patent [19]
Kotecki et al.

[11] Patent Number: 5,973,351
[45] Date of Patent: Oct. 26, 1999

[54] SEMICONDUCTOR DEVICE WITH HIGH DIELECTRIC CONSTANT INSULATOR MATERIAL

[75] Inventors: David E. Kotecki, Hopewell Junction, N.Y.; Son V. Nguyen, San Jose, Calif.

[73] Assignee: International Business Machines Corporation, Armonk, N.Y.

[21] Appl. No.: 08/787,070

[22] Filed: Jan. 22, 1997

[51] Int. Cl.$^6$ .......................... H01L 29/92; H01L 27/108
[52] U.S. Cl. .......................... 257/310; 257/295; 257/301
[58] Field of Search .......................... 257/310, FOR 310, 257/295, 301; 438/54, 3, 240, 780, 781; 148/DIG. 14

[56] References Cited

U.S. PATENT DOCUMENTS

| | | | |
|---|---|---|---|
| 4,490,737 | 12/1984 | Pierce et al. | 257/634 |
| 4,830,981 | 5/1989 | Baglee et al. | 438/243 |
| 5,326,721 | 7/1994 | Summerfelt | 438/3 |
| 5,418,389 | 5/1995 | Watanabe | 257/295 |
| 5,423,285 | 6/1995 | Paz de Araujo et al. | 117/90 |
| 5,438,037 | 8/1995 | Tanaka | 505/329 |
| 5,468,679 | 11/1995 | Paz de Araujo et al. | 438/3 |
| 5,473,171 | 12/1995 | Summerfelt | 257/183 |
| 5,514,904 | 5/1996 | Onga et al. | 257/627 |
| 5,519,234 | 5/1996 | Paz de Araujo et al. | 257/295 |
| 5,753,945 | 5/1998 | Chivukula et al. | 257/295 |

OTHER PUBLICATIONS

J. Choisnet, et al; Structural relationships in close–packed AB2O4 Oxides Involving Spinel, Olivine, and Hexagonal LiFeSnO4 Structures; Jrnl of Solid State Chem. 45, (1982) pp. 280–289.

Charles Kittel; Classification of Ferroelectric Crystals; Introduction to Solid State Physics, 5$^{th}$ Ed.; pp. 414–416. (1976).

Son V. Nguyen; Thesis: Preparation and Photoelectronic Properties of the System Cd2Ge1–xSix)4 and The Crystallographic and Magnetic Properties of Dispersed Nickel Particles on Spherocarb Supports;, (Jun. 1981).

Primary Examiner—Peter Toby Brown
Assistant Examiner—Maria Guerrero
Attorney, Agent, or Firm—Whitham, Curtis & Whitham; Daryl Neff

[57] ABSTRACT

A semiconductor device having a capacitor containing an insulator material having a high dielectric constant and high charge storing capability of the following formula: $(A^1)_x(A^2)_{2-x}(D)_d(B^1)_y(B^2)_{1-y}O_4$ where $A^1$ and $A^2$ are cations, $B^1$ and $B^2$ are anions, $0 \leq x \leq 2$ with the proviso that $A^1$ and $A^2$ are different types of atoms when $0 < x < 2$, and $0 \leq y \leq 1$ with the proviso that $B^1$ and $B^2$ are different types of atoms when $0 < y < 1$, and D is an optional dopant in a total amount of $0 \leq d \leq 0.1$.

11 Claims, 5 Drawing Sheets

SEMICONDUCTOR DEVICE WITH HIGH DIELECTRIC CONSTANT INSULATOR MATERIAL

BACKGROUND OF THE INVENTION

1. Field of the Invention

The invention relates to semiconductor devices incorporating high dielectric constant insulator materials, and, more particularly, to the use of such materials in microelectronics storage applications.

2. Description of the Related Art

Semiconductor DRAM cells have been developed for storing bits of information in volatile memories. An unrelenting goal in DRAM designs has been to minimize the surface area of the cell and its interconnections in order to achieve very high density memories. However, another important goal in DRAM development has been to maximize the capacitance and storage charge of the storage element. It is important to maintain the magnitude of storage charge despite any reductions in cell sizes to avoid read problems and data integrity problems. Also, an additional emphasis in DRAM development has been to maximize capacitance of the storage element, while still minimizing the overall size of the cell, so that the access time of the storage capacitor, as well as the magnitude of the line signal, is less susceptible to being adversely affected by the parasitic capacitances of the drive lines. Accomplishing both goals of minimizing cell size while increasing storage charge and capacitance has proven challenging from a design standpoint.

As one prior approach to achieve both goals, the cell size has been reduced while increasing capacitance and storage charge by providing a thinner dielectric insulator layer between the capacitor plates. However, punch-through problems have limited the extent to which the conventional dielectric layers can be made thinner. In other prior approaches, further reductions in cell size have been obtained while maintaining the charge holding capacity and capacitance of the storage elements by forming three-dimensional capacitor configurations which construct the capacitor in a location out of the plane of the transistors, such as in so-called stacked, trench, and folded capacitors. These three-dimensional capacitor configurations provide an increase in capacitance without incurring a penalty in area.

As one type of conventional capacitor design, a capacitor can be formed by etching a vertical or nearly vertical deep trench of an aspect ratio of greater than 30:1 into a semiconductor surface of a DRAM integrated circuit and depositing a dielectric material, such as $Ta_2O_5$, $SiO_2$, or $SiN_x$, on the side walls and bottom of the trench. A trenched DRAM cell structure of this sort is shown in FIG. 1 where trench dielectric material 10 lines the walls of trench 11, where conventionally used dielectric materials 10 in this regard have been $Ta_2O_5$, $SiO_2$, or $SiN_x$, or a combination of these materials. The trench 11 is then filled with doped polysilicon 12 which forms the second electrode of the capacitor.

In another type of conventional capacitor structure, a stacked capacitor design is shown in FIG. 2, including a substrate 23 having diffusion region 24 formed in its surface and an insulation layer 22 (e.g., silicon dioxide) having a conductive plug 21 (e.g., doped polysilicon or tungsten) formed therein capped with a barrier layer 25 (e.g., $WSi_x$, TaSiN, TiN, or TiAlN). The bottom electrode 26 (e.g., Pt, Ir, Ru, polysilicon, noble metals, or conductive oxides of noble metals) has its exterior surfaces conformally covered by a dielectric material 27, which, in turn, is covered by top electrode 28, which can be formed of the same materials as described for the bottom electrode 26. As dielectric material 27, $SiO_2$, $SiN_x$, or $Ta_2O_5$ has been described, or high dielectric materials 27 have also been in the form of various perovskite dielectrics, namely, as $BaTiO_3$ or $SrTiO_3$, or other like materials of the perovskite family. The $SiO_2$ or $SiN_x$ dielectric materials are typically are used in conjunction with polysilicon electrodes, while the perovskite dielectric materials, viz., $(Ba,Sr)TiO_3$ are used with the other above-mentioned electrode materials.

However, to meet the continuing demands in the industry for even further reductions in the surface area of memory cells, the semiconductor field would be greatly interested in new types of capacitor dielectrics endowed with high capacitance and enhanced charge storage capability as a way of compensating for cell surface area reductions.

A doctoral dissertation by Van S. Nguyen, entitled "Preparation and Photoelectronic Properties of the System $Cd_2Ge_{1-x}SiO_4$ and the Crystallographic and Magnetic Properties of Dispersed Nickel Particles on Spherocarb Supports", Brown University, June 1981, published by UMI Dissertation Services, Bell & Howell Co., Ann Arbor, Mich. 48106, teaches use of an n-type semiconductor material $Cd_2Ge_{1-x}SiO_4$ for preparing a photoanode for photoelectrolysis of water using sunlight. The Nguyen dissertation also teaches $Cd_2GeO_4$, $Cd_2SiO_4$, $Fe_2GeO_4$, and $Fe_2Ge_{1-x}Si_xO_4$ dielectrics which were prepared, or were proposed for future study, for purposes of determining their photoelectronic properties under photoelectrolysis conditions. The Nguyen dissertation does not teach or pertain to microelectronics storage applications such as DRAM device designs.

SUMMARY OF THE INVENTION

It is an object of the present invention to provide a semiconductor structure incorporating a high dielectric, insulator material having enhanced storage charge and capacitance.

The foregoing and other objects of the invention are achieved by a semiconductor structure, including a capacitor comprising a film material having an olivine structure and represented by the following general formula (I):

$$(A^1)_x(A^2)_{2-x}(D)_d(B^1)_y(B^2)_{1-y}O_4 \qquad (I)$$

where $A^1$ and $A^2$ are cations, $B^1$ and $B^2$ are anions, where $0 \leq x \leq 2$ with the proviso that $A^1$ and $A^2$ are different types of atoms when $0<x<2$, and $0 \leq y \leq 1$ with the proviso that $B^1$ and $B^2$ are different types of atoms when $0<y<1$, and D is optional trace amounts of dopant atom(s) such that the total amount of dopant satisfies the inequality $0 \leq d < 0.1$.

In a preferred embodiment, $A^1$ and $A^2$ are independently selected from the group consisting of cadmium, chromium, cobalt, iron, magnesium, nickel, platinum, and titanium, $B^1$ and $B^2$ are independently selected from the group consisting of silicon (Si), germanium (Ge), tin (Sn), and lead (Pb), and optional dopant material D is selected from the group consisting of manganese (Mn), tantalum (Ta), zirconium (Zr), yttrium (Y), and lanthanum (La), or combinations of these dopant materials. Although not required, the dopants D can be integrated into dielectric compound for the purpose of decreasing leakage and enhancing reliability. The coefficient x is preferably $0.05 \leq x \leq 1$. The values of the coefficients x and y in general formula (I) are stoichiometric values.

Several exemplary subclasses of film materials within the scope of general formula (I) include, for example, $Fe_xCd_{2-x}SiO_4$, $Fe_xCo_{2-x}Si_yGe_{1-y}O_4$, $Co_xCd_{2-x}SiO_4$, $Fe_2Si_yGe_{1-y}O_4$, $Co_2Si_yGe_{1-y}O_4$, and $Fe_xCo_{2-x}Si_yGe_{1-y}O_4$.

In a further embodiment of the invention, additional cations and/or anions can be incorporated into the dielectric material as represented by general formula (II):

$$(A^1)_{x_1}(A^2)_{x_2} \ldots (A^n)_{2-(x_1+x_2+\ldots x_{n-1})}(D)_d(B^1)_{y_1}(B^2)_{y_2} \ldots (B^p)_{1-(y_1+y_2+\ldots y_{p-1})}O_4$$

where n and p each are a positive integer value greater than 2, and the series of three or more cations $A^1$, $A^2$, up to $A^n$ are each selected from the group consisting of cadmium, chromium, cobalt, iron, magnesium, nickel, platinum, and titanium, with the proviso that the cations $A^1$, $A^2$ through $A^n$ are different atom types from each other, and where the sum of $x_1+x_2+ \ldots x_n$ equals two, and where anions $B^1$, $B^2$ through $B^P$ are each selected from the group consisting of silicon, germanium, tin, and lead, with the proviso that $B^1$, $B^2$ through $B^P$ are different types of atoms from each other, and the sum of $Y_1+Y_2+ \ldots y_p$ equals 1, and D is the optional dopant material selected from the group consisting of manganese, tantalum, zirconium, yttrium, lanthanum, or combinations thereof, where d is zero or a total value less than 0.1 to provide a trace amount of D. The values of the coefficients x and y in general formula (II) are stoichiometric values.

An exemplary subclass of film materials within the scope of general formula (II) includes, e.g., $(Fe_{x_1}Co_{x_2}Cd_{2-x_1-x_2})(SiO_4)$, where x is defined above.

As to the crystallography of the dielectric materials of general formulae (I) and (II), the materials are polycrystalline and have an olivine structure. By "olivine structure", it is meant a particular crystalline structure in which (Si, Ge, Sn, Pb)O$_4$ tetrahedra are interdispersed with MO$_6$ octahedra, where M is cation as defined herein for $A^1$, $A^2$, and $A^3$. That is, independent (Si, Ge, Sn, Pb)O$_4$ tetrahedra are linked to MO$_6$ octahedra by sharing corners and edges. Two crystallographically independent M atoms are both octahedrally surrounded by six oxygen atoms; these octahedra share edges and corners with both (Si, Ge, Sn, Pb)O$_4$ tetrahedra and adjacent MO$_6$ octahedra. The oxygen atoms form a slightly distorted hexagonal close-packed array. The cations occupy some of the tetrahedral and octahedral interstices. The parenthetical statements used in chemical formulae herein mean that any one of the atom types listed within the parentheses can be used.

Complete oxidation of the dielectric materials of either general formulae (I) or (II) is preferred, such that (Si, Ge, Sn, Pb)O$_4^{4-}$ radicals are formed in the crystal lattice. The complete oxidation (i.e., tetravalent state) of the Si, Ge, Sn or Pb atoms in the dielectric material prevents leakage problems in the dielectric material. This complete oxidation of the Si, Ge, Pb or Sn atoms can be ensured by thermal annealing the dielectric material in an oxygen-containing atmosphere after deposition of the dielectric film on a semiconductor surface. In general, the dielectric materials of general formulae (I) and (II) have greater stability the smaller the atomic weight of $B^1$ and/or $B^2$. For example, this means formula (I) or (II) compounds where $B^1$ is Si will be more stable than those where $B^1$ is Ge, Sn, or Pb, and so forth.

In the present invention, the dielectric materials within the scope of general formulae (I) and (II) generally have a K value ranging from 10 to 500. The dielectric constant K of a material is understood in the field to determine the electrostatic energy which may be stored in that material per unit volume for a given voltage. The value of the dielectric constant K expresses the ratio of the capacitance of a capacitor with a given dielectric to that of the same capacitor having a vacuum (or air) dielectric. The dielectric constant K of air is 1, the reference unit employed for expressing the dielectric constant K.

In one embodiment of the present invention, the dielectric material of general formulae (I) or (II) can be used to provide high dielectric constant insulators for microelectronics storage applications. When used in DRAM products, the dielectric material of formulae (I) and/or (II) affords an enhanced dielectric constant which endows a DRAM memory cell capacitor with higher charge storage capacity. For instance, the dielectric material of formulae (I) and/or (II) can be used in stacked capacitor structures as an insulator layer provided between the lower and upper electrodes, or, alternatively, the dielectric material can be deposited upon trench walls to insulate a storage node of a trench capacitor.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1:
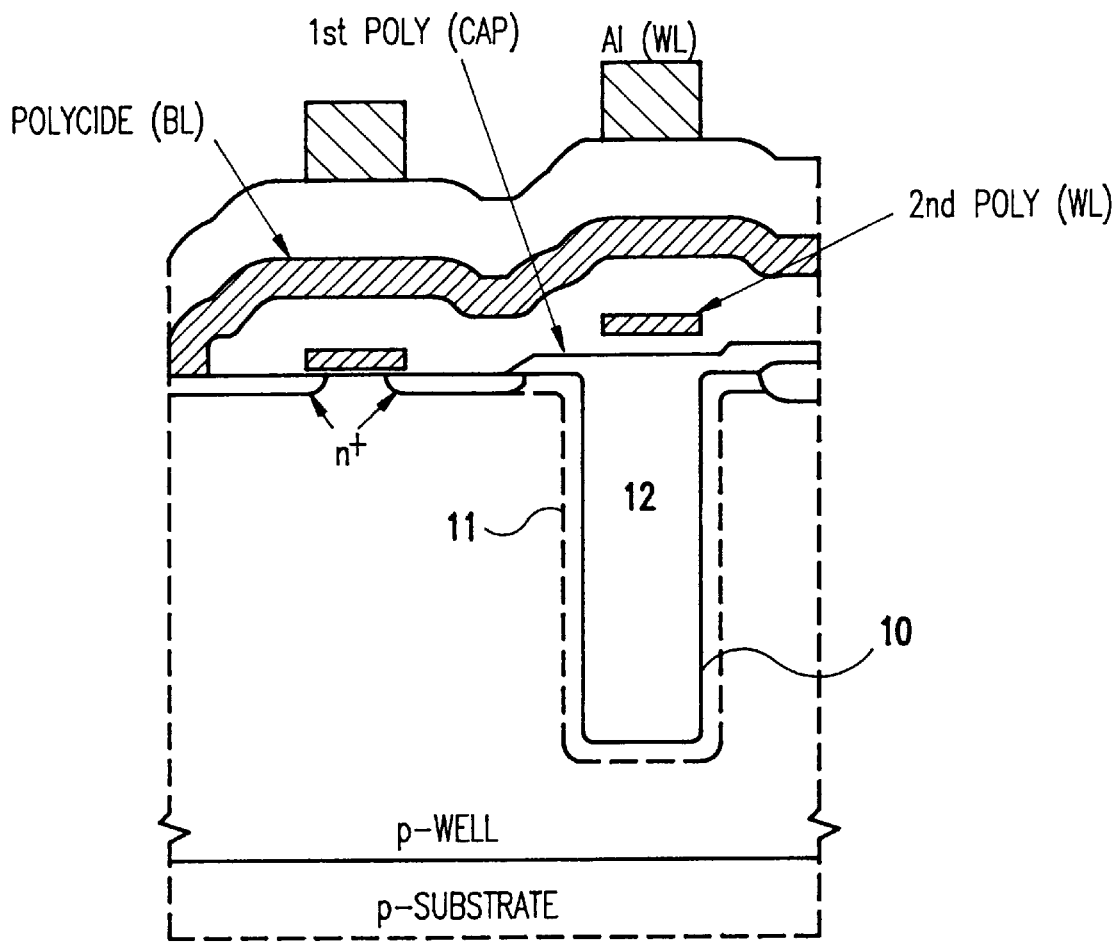
FIG. 1 illustrates in cross-sectional view of a conventional trench capacitor structure for a DRAM device memory cell.
Figure 2:
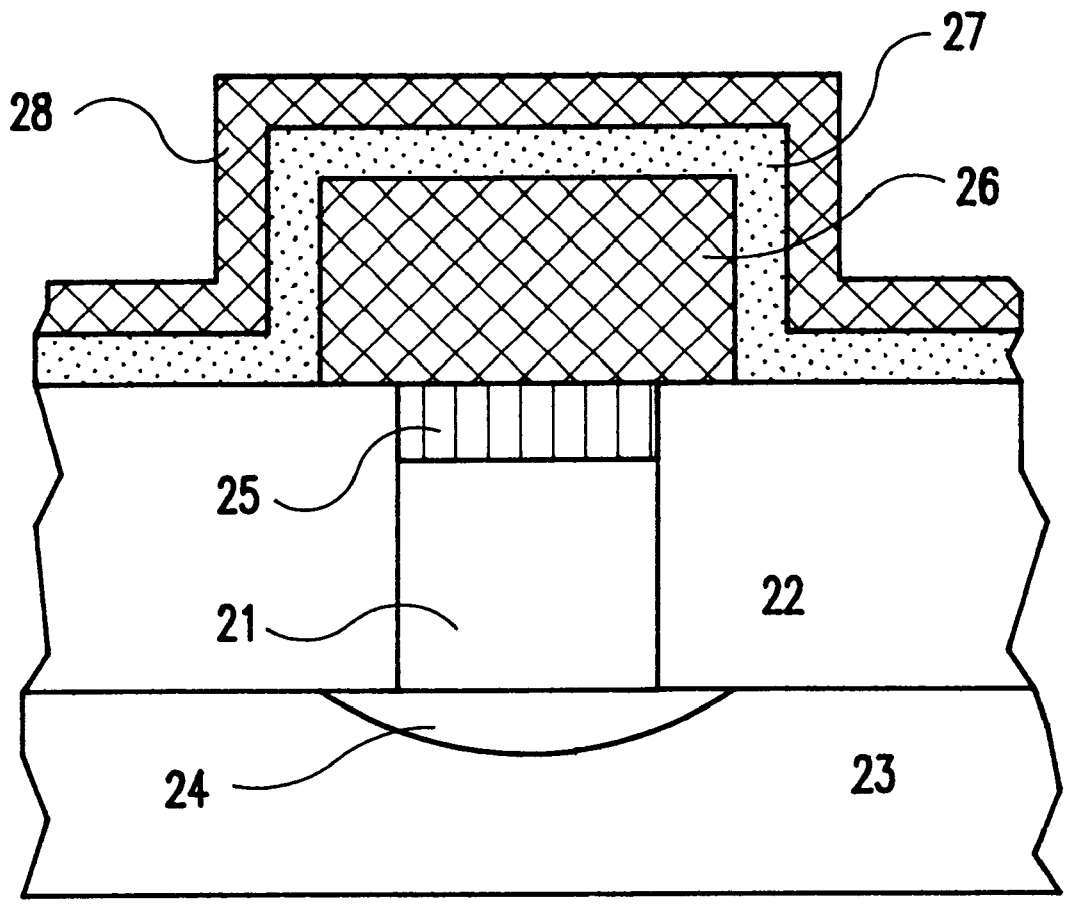
FIG. 2 illustrates in cross-sectional view of a conventional stacked capacitor structure for a DRAM device memory cell.
Figure 3:
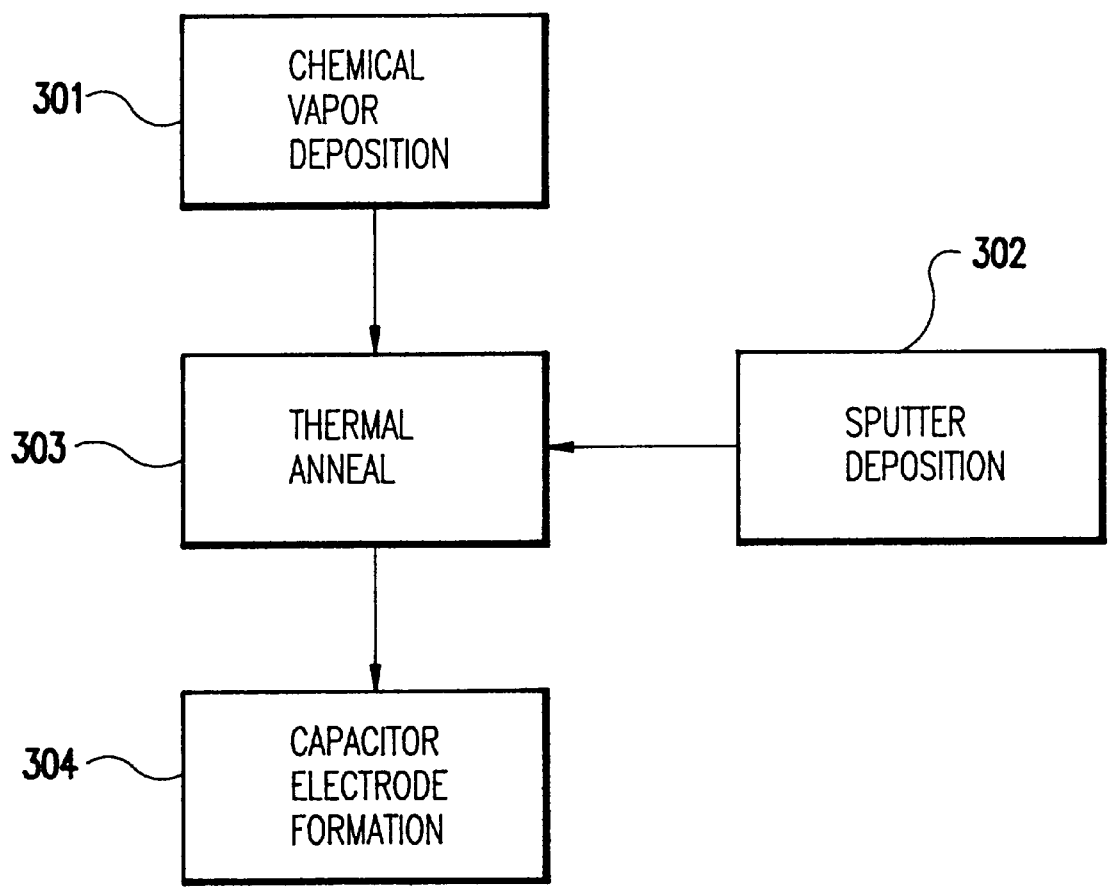
FIG. 3 is a flow chart showing processing schemes for implementing the present invention.

A flow chart is provided in FIG. 3 which summarizes processes for making semiconductor devices having at least one capacitor containing a dielectric film material of formula (I) or (II) as defined herein, or a combination of both.

The dielectric film material represented by general formula (I) is characterized as follows:

$$(A^1)_x(A^2)_{2-x}(D)_d(B^1)_y(B^2)_{1-y}O_4 \qquad (I)$$

where $A^1$ and $A^2$ are cations, $B^1$ and $B^2$ are anions, where $0 \leq x \leq 2$ with the proviso that $A^1$ and $A^2$ are different types of atoms when $0<x<2$, and $0 \leq y \leq 1$ with the proviso that $B^1$ and $B^2$ are different types of atoms when $0<y<1$, and D is optional trace amounts of dopant atom(s) such that the total amount of dopant satisfies the inequality $0 \leq d<0.1$.

In a preferred embodiment, $A^1$ and $A^2$ are independently selected from the group consisting of cadmium, chromium, cobalt, iron, magnesium, nickel, platinum, and titanium, $B^1$ and $B^2$ are independently selected from the group consisting of silicon (Si), germanium (Ge), tin (Sn), and lead, (Pb), and optional dopant material D is selected from the group consisting of manganese (Mn), tantalum (Ta), zirconium (Zr), yttrium (Y), and lanthanum (La), or combinations of these dopant materials. Although not required, the dopants D can be integrated into dielectric compound for the purpose of decreasing leakage and enhancing reliability. The coefficient x is preferably $0.05 \leq x \leq 1$. The values of the coefficients x and y in general formula (I) are stoichiometric values.

Several exemplary subclasses of film materials within the scope of general formula (I) include, for example, $Fe_xCd_{2-x}SiO_4$, $Fe_xCo_{2-x}Si_yGe_{1-y}O_4$, $Co_xCd_{2-x}SiO_4$, $Fe_2Si_yGe_{1-y}O_4$, $Co_2Si_yGe_{1-y}O_4$, and $Fe_xCo_{2-x}Si_yGe_{1-y}O_4$.

In a further embodiment of the invention, additional cations and/or anions can be incorporated into the dielectric material as represented by general formula (II):

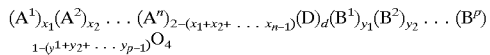

where n and p each are a positive integer value greater than 2, and the series of three or more cations $A^1$, $A^2$, up to $A^n$ are each selected from the group consisting of cadmium, chromium, cobalt, iron, magnesium, nickel, platinum, and titanium, with the proviso that the cations $A^1$, $A^2$ through $A^n$ are different atom types from each other, and where the sum of $x_1+x_2+ \ldots x_n$ equals two, and where $B^1$, $B^2$ through $B^p$ are each selected from the group consisting of silicon, germanium, tin, and lead, with the proviso that $B^1$, $B^2$ through $B^p$ are different types of atoms from each other, and the sum of $y_1+y_2+ \ldots y_p$ equals 1, and D is the optional dopant material selected from the group consisting of manganese, tantalum, zirconium, yttrium, lanthanum, or combinations thereof, where d is zero or a total value less than 0.1 to provide a trace amount of D. The values of the coefficients x and y in general formula (II) are stoichiometric values.

An exemplary subclass of film materials within the scope of general formula (II) includes, e.g., $Fe_{x_1}Co_{x_2}Cd_{2-x_1-x_2})(SiO_4)$, where x is defined above.

In general, as indicated in FIG. 3, there are two alternate techniques within the scope of this invention for incorporating the dielectric material of formulae (I) and/or (II) into a memory cell of a semiconductor device.

In one mode indicated by step 301 in FIG. 3, a film of the dielectric material can be formed directly on a semiconductor substrate in the chemical vapor deposition (CVD) step. In a second mode, as indicated in step 302 of FIG. 3, a film of the dielectric material can be sputter deposited directly on a semiconductor substrate. CVD step 301 and sputtering step 302 both result in a dielectric film having the actual stoichiometry of formula (I) or (II). Whether the dielectric film is deposited by CVD or sputtering, the film is next subjected to annealing, e.g., rapid thermal annealing (RTA) or furnace annealing, in step 303 for the purpose of forming a polycrystalline crystal structure in the dielectric film. The polycrystalline films of formulae (I) and (II) have high dielectric constants and are good insulators. The CVD, sputter deposition, and anneal steps are described in greater detail below.

In step 301, a film of the dielectric material of general formula (I) or (II) is directly formed on a semiconductor wafer by chemical vapor deposition (CVD). The dielectric material film can be formed via CVD, for example, by using a liquid delivery system CVD where liquid forms of the dielectric-forming constituents are flash vaporized at a CVD reactor such that the generated gaseous species produce a microcrystalline or amorphous film having the stoichiometry of the dielectric material of general formula (I) or (II), depending on the starting reagents. The dielectric film can also be formed by a CVD process where the reagents are introduced via a conventional "bubbler" system, such as described in U.S. Pat. Nos. 5,354,516 and 5,381,605, which descriptions are incorporated herein by reference. Generally useful conditions for the liquid source CVD process are provided below:

(a) low pressure: 0.1 to 10 Torr;
(b) wafer temperature: 300 to 700° C.;
(c) controlled wall temperature: 50 to 300° C.;
(d) flow rates: 0.1 to 2.0 SLPM of inerts (e.g., Ar, He) and 0.1 to 2.0 SLPM of oxidizers (e.g., $O_2$, $N_2$, $O_3$); and
(e) liquid flow rates: 0.01 to 0.5 ml/minute.

The dielectric material of formulae (I) or (II) that is formed by the CVD process or the sputtering process described herein, assumes an olivine structure as defined herein. Representative graphical illustrations of the "olivine structure" are shown in the doctoral dissertation by Van S. Nguyen, entitled "Preparation and Photoelectronic Properties of the System $Cd_2Ge_{1-x}SiO_4$ and the Crystallographic and Magnetic Properties of Dispersed Nickel Particles on Spherocarb Supports", Brown University, June 1981, published by UMI Dissertation Services, Bell & Howell Co., Ann Arbor, Mich. 48106, which descriptions are incorporated herein by reference.

In an alternate mode of the invention indicated in step 302 in FIG. 3, the dielectric film of formula (I) or (II) is directly sputtered onto a semiconductor surface. A sputtering target having the composition of formulae (I) or (II) is sputtered onto a semiconductor substrate. Preferably, magnetron sputtering is employed to deposit the dielectric material by sputtering into the trenches. Argon, oxygen, or combinations thereof can be used as sources of the energetic ions. A magnetic strength of 100–200 gauss and a chamber pressure of 0.1 to 1 pascal can used. Radio frequency or dc sputtering also could be used.

The sputtering target can be formed by heat and pressure sintering of constituents of the dielectric material in stoichiometric amounts. For example, a mixture of separate starting powders derived from elemental or intermediary compound forms of the ingredients of formula (I) or (II), can be prepared and the mixture is then sintered together under high temperature and pressure to form the formula (I) or (II) compound. For instance, free metal, such as iron or cobalt, or intermediary oxide compounds thereof, such as iron or cobalt oxide, as well as germanium oxide or silicon oxide, and so forth, can be combined with attention given to ensure that the aggregate amounts of each atomic constituent will permit the stoichiometry of formula (I) or (II) to be realized. During sintering, the individual ingredients will bond together in the olivine structure. Sintering conditions useful for forming the sputtering target in this manner generally involve compression of the powder mixture at 50 to 1,000 atmospheres of pressure and 300 to 800° C.

Film deposition of the dielectric material on exposed surfaces of a semiconductor substrate by sputtering from the target is possible because the composition of the film as deposited is locked to the composition of the target material, according to phenomena understood in the field.

Next, in step 303 shown in FIG. 3, rapid thermal or furnace annealing is used to crystallize the dielectric film material. That is, whether the dielectric film material is formed on a substrate by CVD, or, alternatively, is deposited by sputtering, an anneal operation is used to convert the morphology of the dielectric film into a polycrystalline phase.

RTA can be effected using a conventional arrangement involving tungsten-halogen lamps housed in a water-cooled reflective enclosure which glow through a quartz isolation tube to heat one or both sides of the wafer located within the isolation tube. The wafer surface is blanketed with in air (source of oxygen) inside the isolation tube. A temperature within the isolation tube of 400 to 1,050° C. is created with an exposure time of about 30 to 60 seconds. This type of RTA system is a so-called isothermal rapid annealing system. A polycrystalline phase film of the formula (I) or (II) compounds described herein is thereby formed.

The crystallization anneal could also be produced in a conventional furnace at a temperature of 400 to 1,050° C. for a duration of five minutes to many hours.

It is optimal to use an oxygen-containing gas, such as air, to blanket the wafer surface during RTA. This practice ensures that the Si, Ge, Sn, or Pb atoms in the formula I compositions are fully oxidized to form $(Si, Ge, Sn, Pb)O_4^{4-}$ radicals in the composition. The dielectric film composition is less prone to charge leakage when the Si, Ge, Sn and/or Pb atoms in the composition are tetravalent with oxygen.

The dielectric constant K values for the dielectric compounds of formula (I) and (II), after RTA, generally range from 10 to 500, and more typically from 20 to 300. The high dielectric constant film materials of general formula (I) and (II) exhibit excellent charge storing capability and low leakage.

In step 304 of FIG. 3, conventional processing can be implemented to form the second capacitor electrode, transistor and interconnections in order to complete the DRAM device.

Figure 4:
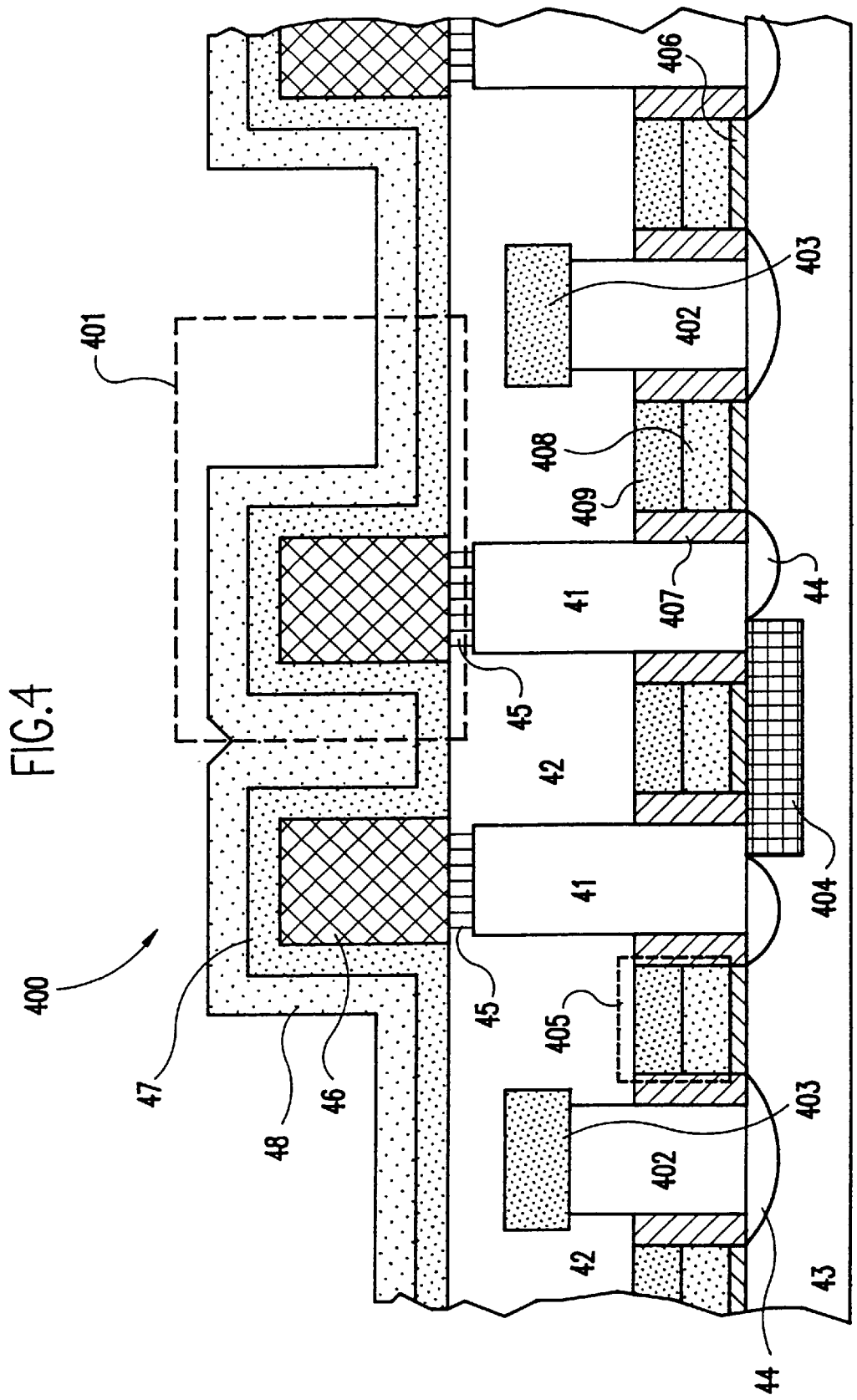
FIG. 4 illustrates in cross-sectional view of a DRAM device memory cell with a stacked capacitor incorporating dielectric material of general formula (I) or (II) in the memory cell.

As an example of a specific application of this invention, FIG. 4 shows a DRAM device 400 with a stacked capacitor structure 401 incorporating dielectric films of formula (I) or (II). Directing attention to the stack capacitor structure 401 contained within the imaginary hatched lines as indicated in FIG. 4, the dielectric film layer 47 of formula (I) or (II), or a combination of both, is formed on bottom electrode 46 by the CVD or sputtering steps defined herein. The dielectric film 47 completely covers bottom electrode 46 and continues onto the surface of insulation layer 42. The dielectric film 47 is then subjected to an anneal as described herein to form the polycrystalline phase. Then, top electrode 48 is formed over dielectric film layer 47. Alternatively, it is also possible to delay the anneal step until after the top electrode 48 is formed on dielectric film 47. The bottom electrode 46 and top electrode 48 can be formed of conventional materials, such as Pt, Ir, Ru, noble metals, conductive oxides of noble metals, or conductive nitrides and oxides.

Other features of the DRAM cell 400 shown in FIG. 4 are important to the operation of the device, but are not essential to the description of the dielectric films of formula (I) or (II) used in the present invention. These other features include conductive plug 41; insulation layer 42; semiconductor substrate 43; diffusion region 44; plug barrier layer 45 (e.g., $WSi_x$, TaSiN, TiN, or TiAlN); bitline contact 402; bitline 403; isolation region 404; wordline structure 405; gate oxide 406; sidewall spacer 407; polywordline 408; and silicide contact 409. One of ordinary skill will appreciate the functions of these other above-named features and procedures for making same.

Figure 5:
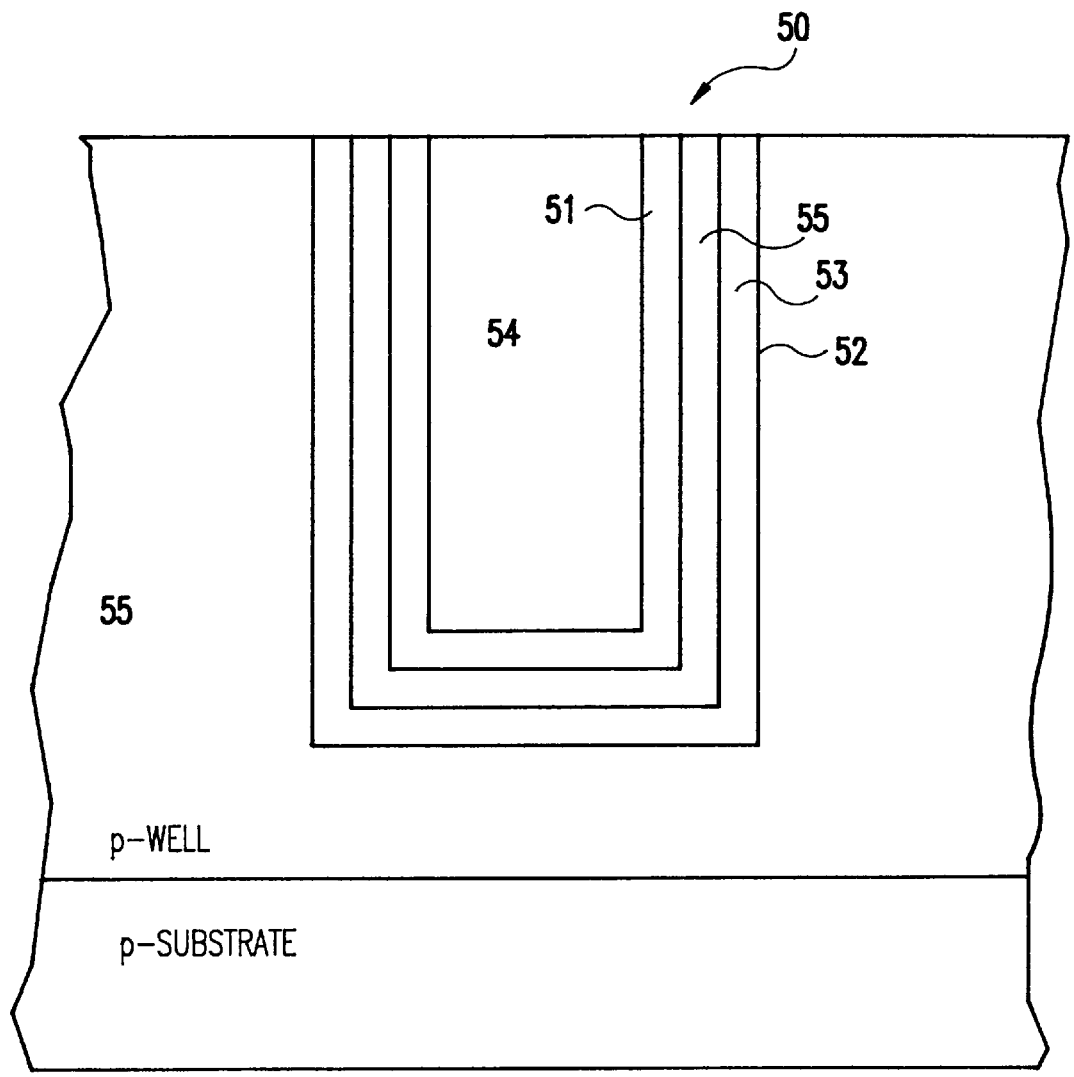
FIG. 5 illustrates in cross-sectional view of a DRAM device memory cell with a trench capacitor structure incorporating dielectric material of general formula (I) or (II) in the memory cell.

Alternatively, the dielectric film material of formula (I) or (II) can be used as a trench liner for a trench capacitor structure of a DRAM device. For instance, by reference to FIG. 5, a trenched cell structure 50 is shown where dielectric film material 51 having the composition of formula (I) or (II), or a combination of these materials, is formed inside trench 52 in a manner forming an insulating layer around counter electrode 54. To accomplish this, the trench 52 is etched into the surface of the semiconductor layer 55 in a previous step according to conventional processing techniques. The trench 52 can be a deep trench having an aspect ratio of 30:1 or more. Before deposition of dielectric film 51 in the trench 52, an optional barrier material 53 (e.g., $WSi_x$, TaSiN, TiN, or TiAlN) and optional non-silicon electrode material 55 can be deposited in the trench 52. The dielectric film 51 can be deposited onto the exposed trench walls of trench 52, or the inner surfaces of optional non-silicon electrode material 55, if used, by the CVD or sputtering steps described herein. After depositing the dielectric film 51, the trench 52 is then filled with conductive material 54 (e.g., Pt, Ir, Ru, noble metals, conductive oxides of noble metals, or conductive nitrides and oxides), which forms the second electrode of the capacitor. The deposited dielectric film 51 is subjected to the crystallization anneal operation as described herein to form the polycrystalline phase. The anneal step can be performed on deposited dielectric film 51 either before or after the trench is filled with the conductive material 54. The transistor and metal wiring (not shown) necessary to complete the DRAM device can then be formed according to conventional processing.

While the invention has been described in terms of its preferred embodiments, those skilled in the art will recognize that the invention can be practiced with modification within the spirit and scope of the appended claims.

We claim:

1. A semiconductor device, including: a capacitor comprising an insulator material having an olivine structure, wherein said insulator material is represented by the general formula (I):

(I)

where $A^1$ and $A^2$ are cations, $B^1$ and $B^2$ are anions, $0 \leq x \leq 2$ with the proviso that $A^1$ and $A^2$ are different types of atoms when $0<x<2$, and $0 \leq y \leq 1$ with the proviso that $B^1$ and $B^2$ are different types of atoms when $0<y<1$, and D is an optional dopant in a total amount of $0 \leq d \leq 0.1$.

2. The semiconductor device of claim 1, wherein $A^1$ and $A^2$ are independently selected from the group consisting of cadmium, chromium, cobalt, iron, magnesium, nickel, platinum, and titanium, $B^1$ and $B^2$ are independently selected from the group consisting of silicon (Si), germanium (Ge), tin (Sn), and lead (Pb), and optional dopant material D is selected from the group consisting of manganese (Mn), tantalum (Ta), zirconium (Zr), yttrium (Y), and lanthanum (La), or combinations of these dopant materials.

3. The semiconductor device of claim 1, wherein said insulator material is selected from the group consisting of $Fe_xCd_{2-x}SiO_4$, $Fe_xCo_{2-x}Si_yGe_{1-y}O_4$, $Co_xCd_{2-x}SiO_4$, $Fe_2Si_yGe_{1-y}O_4$, $Co_2Si_yGe_{1-y}O_4$, and $Fe_xCo_{2-x}Si_yGe_{1-y}O_4$.

4. The semiconductor device of claim 1, wherein said insulator material has dielectric constant K value between 10 and 500.

5. The semiconductor device of claim 1, wherein said capacitor comprising said insulator material forms part of a memory cell.

6. The semiconductor device of claim 1, wherein said capacitor is a stacked capacitor.

7. The semiconductor device of claim 1, wherein said capacitor is trench capacitor.

8. A semiconductor device, including:

a capacitor comprising an insulator material having an olivine structure, wherein said insulator material is represented by general formula (II):

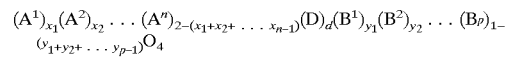

where n and p each are a positive integer value greater than 2, and $A^1$, $A^2$, up to $A^n$ are each selected from the group consisting of cadmium, chromium, cobalt, iron, magnesium, nickel, platinum, and titanium, with the proviso that $A^1$, $A^2$ through $A^n$ are different atom types from each other, and where the sum of $x_1+x_2+\ldots x_n$ equals two, and where $B^1$, $B^2$ through $B^p$ are each selected from the group consisting of silicon, germanium, tin, and lead, with the proviso that $B^1$, $B^2$ through $B^p$ are different types of atoms from each other, and the sum of $y_1+y_2+\ldots y_p$ equals 1, and D is an optional dopant material selected from the group consisting of manganese, tantalum, zirconium, yttrium, and lanthanum, or combinations thereof, where $0 \leq d < 0.1$.

9. A DRAM device, including a capacitor comprising an insulator material having an olivine structure, wherein said insulator material is represented by the general formula (I):

$$(A^1)_x(A^2)_{2-x}(D)_d(B^1)_y(B^2)_{1-y}O_4 \qquad (I)$$

where $A^1$ and $A^2$ are cations, $B^1$ and $B^2$ are anions, $0 \leq x \leq 2$ with the proviso that $A^1$ and $A^2$ are different types of atoms when $0<x<2$, and $0 \leq y \leq 1$ with the proviso that $B^1$ and $B^2$ are different types of atoms when $0<y<1$, and D is an optional dopant in a total amount of $0 \leq d < 0.1$.

10. The DRAM device of claim 9, wherein said insulator material is selected from the group consisting of $Fe_xCd_{2-x}SiO_4$, $Fe_xCo_{2-x}Si_yGe_{1-y}O_4$, $Co_xCd_{2-x}SiO_4$, $FeSiO_4$, $CdSiO_4$, $Fe_2Si_yGe_{1-y}O_4$, $Co_2Si_yGe_{1-y}O_4$, and $Fe_xCo_{2-x}Si_yGe_{1-y}O_4$.

11. The DRAM device of claim 9, wherein said insulator material has dielectric constant K value between 10 and 500.

* * * * *